United States Patent [19]

Kinoshita et al.

[11] Patent Number: 4,599,657

[45] Date of Patent: Jul. 8, 1986

[54] IMAGE PICK-UP DEVICE

[75] Inventors: Toshio Kaji, Kanagawa; Nobuyoshi Tanaka, Kanagawa; Takao Kinoshita, Tokyo; Akihiko Tojo, Kanagawa; Tsutomu Takayama, Kanagawa, all of Japan

[73] Assignee: Canon Kabushiki Kaisha, Tokyo, Japan

[21] Appl. No.: 452,500

[22] Filed: Dec. 23, 1982

[30] Foreign Application Priority Data

Dec. 29, 1981 [JP] Japan .................................. 56-215333
Dec. 29, 1981 [JP] Japan .................................. 56-215337
Dec. 29, 1981 [JP] Japan .................................. 56-215342
Dec. 29, 1981 [JP] Japan .................................. 56-215343
Dec. 29, 1981 [JP] Japan .................................. 56-215344
Dec. 29, 1981 [JP] Japan .................................. 56-215345

[51] Int. Cl.$^4$ .......................... H04N 5/76; H04N 5/30
[52] U.S. Cl. ..................................... 358/335; 358/213; 358/221; 358/228; 358/906
[58] Field of Search ............... 358/335, 906, 213, 221, 358/209, 228; 360/33.1, 35.1

[56] References Cited

U.S. PATENT DOCUMENTS 4,366,501 12/1982 Tsunekawa et al. ............ 358/906 X
4,415,937 11/1983 Nishizawa et al. .................. 358/335
4,420,773 12/1983 Toyoda et al. ................. 358/906 X

FOREIGN PATENT DOCUMENTS 127308 10/1979 Japan .................................... 358/906

Primary Examiner—Robert L. Richardson
Attorney, Agent, or Firm—Toren, McGeady, Stanger, Goldberg & Kiel

[57] ABSTRACT

Disclosed is an image pick-up device which uses a charge transfer type solid state image pick-up device, and a shutter so as to form a high quality picture signal in which smear is prevented by prohibiting the incidence of the light on the device while the charge is transferred in the device. The device is driven by a clock signal for still photography in order to assure high quality picture information for one frame. The photographic parameters are automatically changed or the monitor is changed between the motion picture photography mode and the still photographing mode.

13 Claims, 19 Drawing Figures

F I G. 14

| a | b | c | | A | B |
|---|---|---|---|---|---|
| 0 | 0 | 0 | PROGRAM MODE | x | y |
| 0 | 0 | 1 | APERTURE PREFERENCE MODE | SET VALUE OF SE3 | y |
| 0 | 1 | 0 | CONTINUOUS MODE | x | y |
| 0 | 1 | 1 | SPEED LIGHT MODE | SET VALUE OF SE3 | 0 |
| 1 | 0 | 0 | STORE TIME PREFERENCE MODE | x | CONSTANT VALUE OF SE2 |
| 1 | 0 | 1 | MANUAL MODE | SET VALUE OF SE3 | SET VALUE OF SE1 |

IMAGE PICK-UP DEVICE

BACKGROUND OF THE INVENTION

1. Field of the invention The present invention relates to an image pick-up device suited for one shot image pick-up, particularly a picture recording device with improved efficiency and able to provide improved picture quality by use of a solid image sensor in combination with a shutter.

2. Description of the Prior Art

In video cameras using a solid state image sensor such as a CCD, the storage, the transfer, and the read out of the image are carried out at a certain predetermined period.

Consequently, the storage time is constant so that the quality of the picture degrades depending on adverse conditions of an object such as when the object has a quick motion or high brightness.

Even in a conventional frame transfer type CCD, for example, a strong light falls incident on the light sensing part while the charge formed in the light sensing part is transferred to the storage portion, and the light is superposed on the charge during the transfer as noise over a wide range. This causes a smear phenomenon and degrades the picture quality.

In an interline transfer type CCD, although the vertical shift register is shaded, light of long wave length falls obliquely upon the substrate under the vertical shift register to produce minority carriers so that there is a possibility of smear in the same way. Particularly, in a interline transfer type CCD, the charge in the vertical register is normally transferred 1 bit every horizontal period of the TV signal so that the above problem is very likely to occur.

Also known is a device in which an overflow drain gate beside each picture element cuts the charge in the light sensing part to control the storage timing and the storage time of the photo electrons and to transfer the stored charge periodically.

Such a device makes it possible not only to read out the signal at the TV rate but also to optionally set the storage time. However, if the storage time is shortened, the S/N decreases substantially as described and a smear results during the charge transfer.

Further, a conventional video camera is designed for continuous photography and a satisfactory image signal cannot bo obtained if only one shot is desired to be photographed.

Also, when the image pick-up device is provided with a video monitor, it is impossible to confirm the one shot picture image.

SUMMARY OF THE INVENTION

It is, accordingly, an object of the present invention to provide an improved image pick-up device free from the above shortcomings.

It is another object of the present invention to provide an image pick-up device in which the smear is hard to take place.

It is further another object of the present invention to provide an image pick-up device which can obtain a proper picture image signal even for a one shot photographing.

It is further another object of the present invention to provide an image pick-up device in which a monitored picture image is not disturbed when continuous photographing and one-shot photographing are changed over therebetween.

It is further another object of the present invention to provide an image pick-up device by which the image information obtained from the one-shot photographing can be confirmed by the monitor.

One of main features of the present invention is that the scanning period of the image pick-up element is made constant also for the still, namely the one-shot mode in order to achieve such various purposes. Thus, it is remarkably easy to synchronize the whole system.

Another feature of the present invention is that a shutter for the still photographing is provided, that the shutter is opened during the continuous mode and closed for a certain predetermined time during the still mode, and that in order to decrease the smear largely, the shutter is not opened until the charge in the light sensing part after the shutter close has been transferred to a non-light-receiving part. Further, a switch (trigger switch) for starting the still mode is provided in such a manner that the clocking for controlling the shutter closing is started after the first transfer signal after the shutter operation is obtained so that the synchronization for scanning the image pick-up elements is not disturbed. Further, in accordance with the present invention a stop means for stopping the driving such as for the scanning of the above image pick-up elements since the first transfer signal after the operation of the still mode start switch till the first transfer signal after the shutter closing is provided so that even during the still mode the scanning synchronization signal is not disturbed, whereby after the still mode the continuous mode can be quickly resumed.

Further, the device is so designed that the exposure parameters returns to the initial states when the exposure parameters are changed over only during the still mode and the continuous mode is again resumed so that the image on the monitor is stabilized. Further, a memory means for memorizing the image output from the image pick-up means during the continuous mode is provided in such a manner that the memory is reset periodically and when the mode is changed over to the still mode said reset is prohibited, whereby the content of the memory means is led to the monitor means so that even if a short time still mode is inserted in the continuous mode the monitoring is not disturbed.

Further, in accordance with the present invention a means for periodically sample holding a part of the output of the image pick-up means during the continuous mode is provided in such a manner that the output is made use of as the object brightness information, while by stopping the sampling along with the change over into the still mode the information during the continuous mode can be successively used.

According to one embodiment of the present invention, the periodical storage of the charge in the light sensing part, the periodical transfer of the charge in the light sensing part is accomplished and the light incidence upon the above image sensor is prohibited by the shutter at least during the above transfer period in such a manner that in this way the smear also at the time of the continuous photographing can be avoided.

Further, in accordance with another embodiment of the present invention, the shutter is periodically closed in synchronization with the driving period of the above image sensor, while the shutter closing time is made to correspond to the transfer time of the above image sensor.

Further, in accordance with further another embodiment of the present invention, besides the above features, by changing the duty cycle during the above shutter closing time the quantity of the image information stored in the light sensing surface of the image sensor is changed.

Further, in accordance with further another embodiment of the present invention the synchronization signal generating means is changed by the operation of the switch means when the continuous mode is changed over into the one shot photographing or the still mode in order to carry out a completely different new storage and scanning from the previous scanning period.

Consequently, the still photographing can be carried out immediately after the triggering.

Other purposes and features of the present invention will be clear from the description hereinbelow with reference to the accompanying drawings.

BRIEF DESCRIPTION OF THE DRAWINGS

FIG. 14 shows the input-output state of the calculation circuit OP.

DESCRIPTION OF THE PREFERRED EMBODIMENTS

Figure 1:
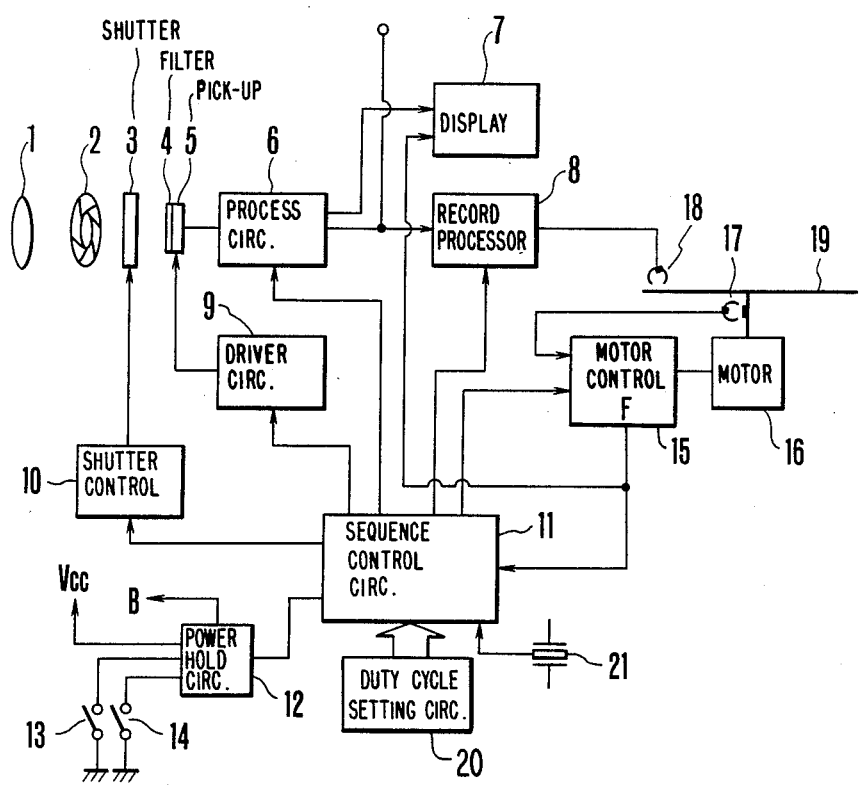
FIG. 1 shows a block diagram of an example of the image pick-up device of the invention.

Below the present invention will be explained in detail according to the drawings of the embodiments hereof. FIG. 1 shows a block diagram of an embodiment of the image pick-up device of the present invention. In the drawing, 1 is the image pick-up optical system, 2 is the mechanical or the physical property diapharagm means and 3 is the mechanical or the physical property shutter means which can be used in common with the diaphragm means 2. 4 is the color filter, 5 is the image pick-up device, 6 is the image signal processing circuit for converting the output of the image pick-up device into a proper form of signal for monitoring by the display device 7, 8 is the recording signal processing circuit for converting the output of the circuit 6 into a proper form of signal for recording, 9 is the driver circuit for supplying a pulse needed for scanning, the transfer, the reading out, the charge clearing and so on, 10 is the shutter driving control circuit for controlling the opening and closing the shutter means, 11 is the sequence control circuit for controlling the drive timing of the whole image pick-up device such as the above image signal processing circuit 6, the recording signal processing circuit 8, the driver circuit 9, the shutter drive circuit 10, the motor control circuit 15, 12 is the power source holding circuit, 13 is the switch to be closed with the first stroke of a 2 stroke switch and 14 the switch to be closed with the second stroke, whereby by closing the switch 2 the current supply is started and the image is monitored by the display device 7, while by closing the switch 14 the recording is started.

Vcc is the power source and B the power source line to each circuit. Further, 15 is the motor control circuit, 16 is the motor to be controlled in the rotation speed and the phase by the motor control circuit, 17 is the detecting head for detecting the rotation phase of the motor, 18 for example a magnetic head for recording the output of the above recording signal processing circuit 8 and 19 the magnetic disc as the recording medium on which the signal is recorded by the magnetic head. 20 is the duty cycle setting circuit of the present invention for setting the closing time of the shutter 3 and 21 the clock generator.

Figure 2A:
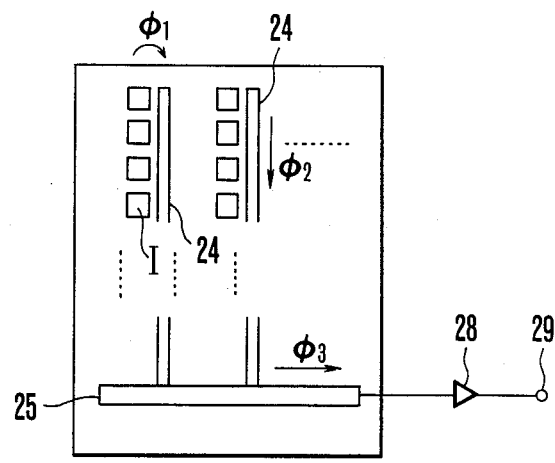
FIGS. 2(a) and (b) show an example of the image pick-up device applicable to the present invention.
Figure 2B:
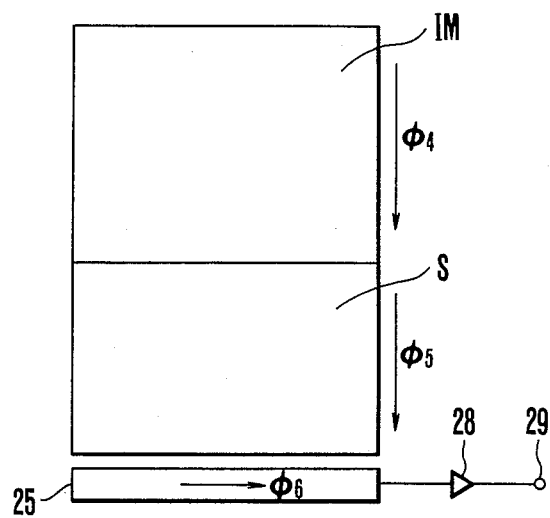

FIGS. 2(a) and (b) show respectively an example of the image pick-up device 5 applicable to the embodiment in FIG. 1, whereby FIG. 2(a) shows the interline transfer type CCD, while FIG. 2(b) shows the frame transfer type CCD. Hereby, the image pick-up device applicable to the present invention is not limited to the above.

In FIG. 2, I is the light sensing part, 24 is the vertical register, 25 is the horizontal register, IM is the light sensing part and S the storage part totally shaded. 28 is the power amplifier and 29 the output terminal. $\phi 1$ is the pulse for shifting the charge in the light sensing part I to the vertical shift register 24, $\phi 2$ is the vertical shift pulse, $\phi 3$ and $\phi 6$ the horizontal shift pulses, $\phi 4$ the transfer pulse for transferring the charge in the light sensing part IM into the storage part and $\phi 5$ the pulse for transferring the charge in the storage part S to the horizontal shift register.

Figure 3:
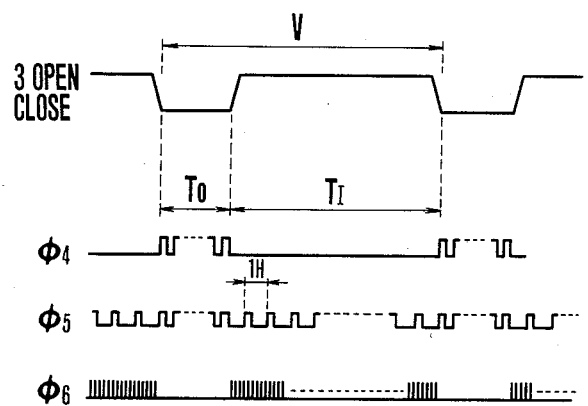
FIG. 3 shows the timing of the operation of the important part of the first embodiment of the present invention.

FIG. 3 shows the operation timing of the first embodiment of the present invention. Hereby, by operating b the switch 13 is the pulses like $\phi 4$–$\phi 6$ in FIG. 3 are supplied from the driver circuit 9 to the frame transfer type CCD as shown in FIG. 2 in accordance with clock of the generator 21.

When for example 1H is the period for one horizontal scanning of the TV signal, the time $T_0$ corresponds to the vertical blanking period of abt. 20H, whereby the time $T_I$ is one vertical scanning period of for example 262.5H, while the time V is one vertical scanning period of for example abt. 1/60 sec.

Because as is shown in the drawing in accordance with the present invention the shutter 3 is closed at least during the transfer period of the frame transfer type image pick-up element by the shutter drive circuit, it can be prevented that a noise is part on the charge formed in the light sensing part IM of the image pick-up element and transferred to the storage part, which improves the picture quality. Further, the shutter is closed during the transfer period there is no fear for the smear and it is possible to prolong the transfer time during the vertical blanking period. Consequently, the charge in CCD is hard to assume the stopped state and the irregular dark current can be decreased.

Figure 4A:
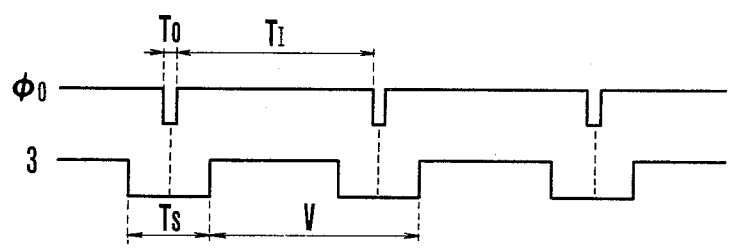
FIGS. 4(a) and (b) show the timing of the second embodiment.

FIGS. 4(a) and (b) show the second example of the present invention. In the drawing, $\phi 0$ is the vertical blanking pulse including the vertical synchronization signal when the pulses φ4 and φ5 are supplied as is shown in FIG. 3 while the level of the pulse φ0 is low, the charge in the light sensing part IM is transferred to the storage part S. Further, during the vertical scanning period T<sub>f</sub> the charge in the storage part S is read out by the pulses φ5 and φ6 with the television rate, while during this period a new field signal is stored in the light sensing part IM.

In accordance with the present embodiment the shutter 3 is closed by the shutter driving circuit in synchronization of this synchronization signal φ0. Further, its closing period Ts is set as Ts/V by the duty cycle setting circuit 20 in FIG. 1. Further the present embodiment is synchronized in such a manner that the middle of the shutter closing period Ts corresponds with that of the synchronization signal φ6.

Consequently, the time (V−Ts) is the incident time of the picture on the light sensing part IM of CCD and the substantial storage time is controlled. Further, CCD is normally driven with the television signal rate so that the standard television receiver can carry out the reproduction.

Figure 4B:
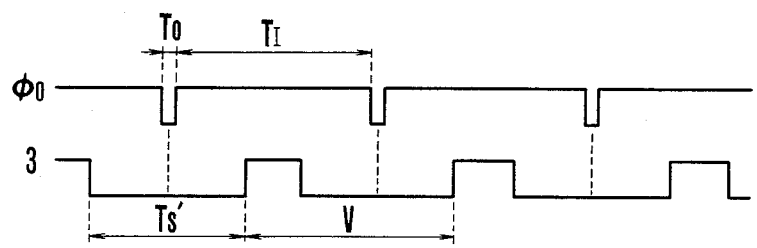

FIG. 4(b) shows an example in which the duty of the opening and the closing of the shutter is varied, whereby the time (V−T's) is shortened.

Figure 5A:
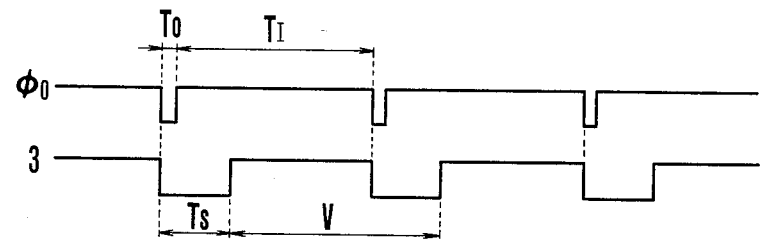
FIGS. 5(a) and (b) show the timing of the third embodiment.
Figure 5B:
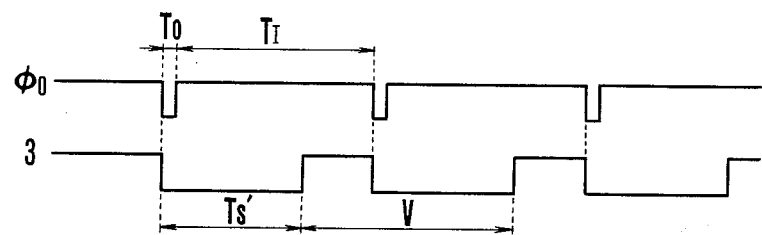

FIGS. 5(a) and (b) show the timing of the third embodiment of the present invention. The difference between the present embodiment and the second one is that the duty Ts/V of the shutter closing is varied while the start timing of the shutter closing is synchronized with the rising up of the signal φ0.

Figure 6A:
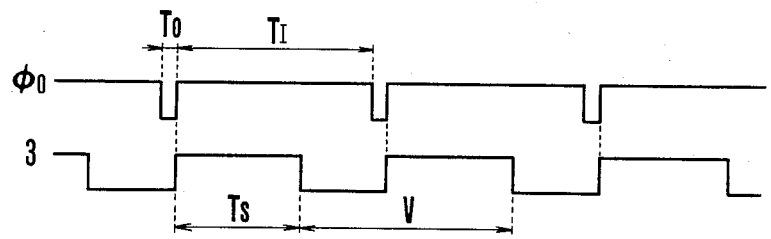
FIGS. 6(a) and (b) show the timing of the fourth embodiment.
Figure 6B:
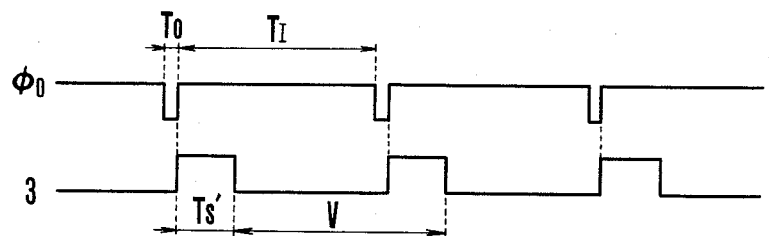

FIGS. 6(a) and (b) show the timing of the fourth embodiment, which is characterized in that the duty Ts/V is adjusted while the timing of the shutter closing is synchronized with the rising up of the signal φ0.

Figure 7:
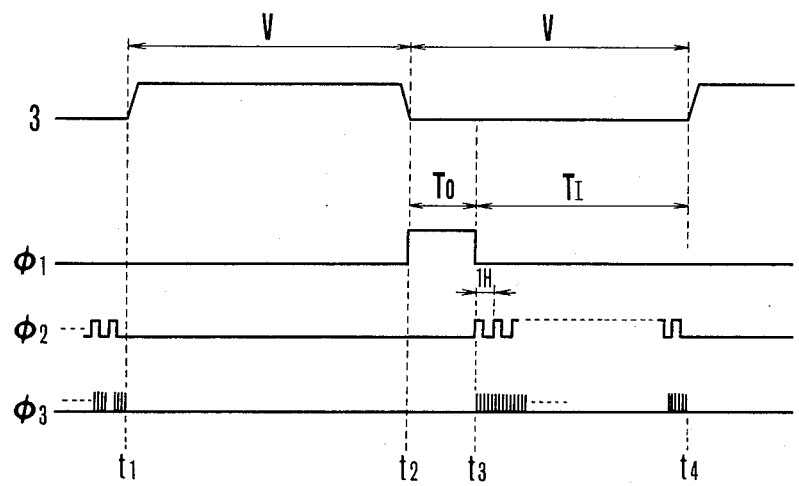
FIGS. 7 to 9 show respectively the timing of the fifth to the seventh embodiment.

FIG. 7 shows the timing of the fifth embodiment of the present invention, which can be applied to such an image pick-up device as obtaining the signal for one field intermittently at the interval of 1/60 sec. Further, the image pick-up element used here is the interline transfer type CCD shown in FIG. 2(a).

In case of the present invention the shift pulse φ1 is supplied from the driver circuit 9 at every 1/30 sec. during the time T<sub>0</sub> corresponding to the vertical blanking period and after then the signals φ3 of the number of the horizontal picture elements are supplied for one pulse φ2 so as to carry out the reading out. Consequently, the charge stored in the light sensing part I during the time between t1 and t2 is transferred to the vertical register during the time between t2 and t3 and read out during the time between t3 and t4 corresponding namely to the next vertical scanning period so as to be output.

Figure 8:
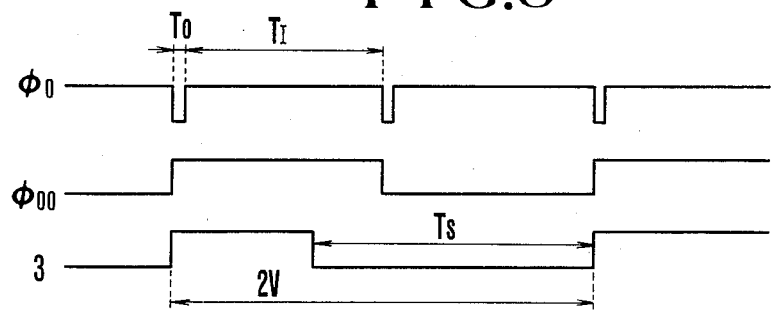
Figure 9:
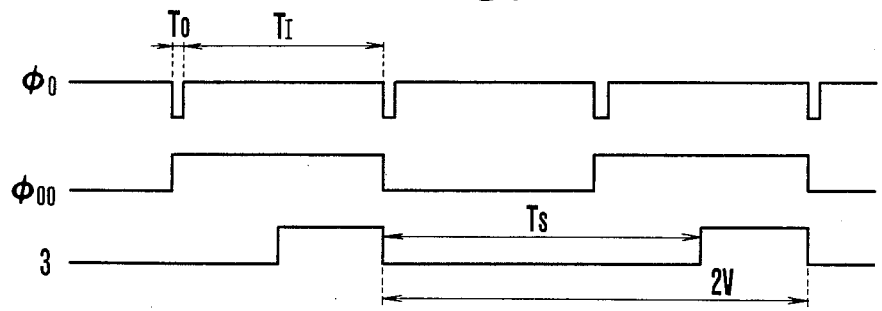

FIGS. 8 and 9 show the timing of the sixth embodiment respectively that of the seventh embodiment of the present invention. The difference between the present embodiment and the fifth one is that the synchronozation timing for the periodical control of the shutter is different.

Further, the image forming time can be controlled by varying the duty Ts/2V of the shutter closing by the setting circuit 20.

The members having the same figures as those in FIGS. 3–7 are the same members. φ00 is the pulse φ0 divided in two in frequency. The shutter opening in FIG. 8 is synchronized with the rising up of the pulse φ00 and that in FIG. 9 with the falling down of the pulse φ00.

As described above in detail in case of the present embodiment the shutter is closed at least in synchronization with the periodical transfer of the charge in the image sensor so that it is possible to avoid the smear. Further, by varying the duty of the shutter closing the amount and the time of the image store in the image sensor can be varied, which is effective. Consequently, a high quality picture can be obtained, while it is suited for the continuous photographing.

Further, the shutter which can be applied to the present embodiment can be any one that has a high response. However, the physical property shutter such as of liquid crystal or PLZT is easy to realize.

Further, the mechanical shutter such as the rotary shutter is also easy to realize.

Figure 10:
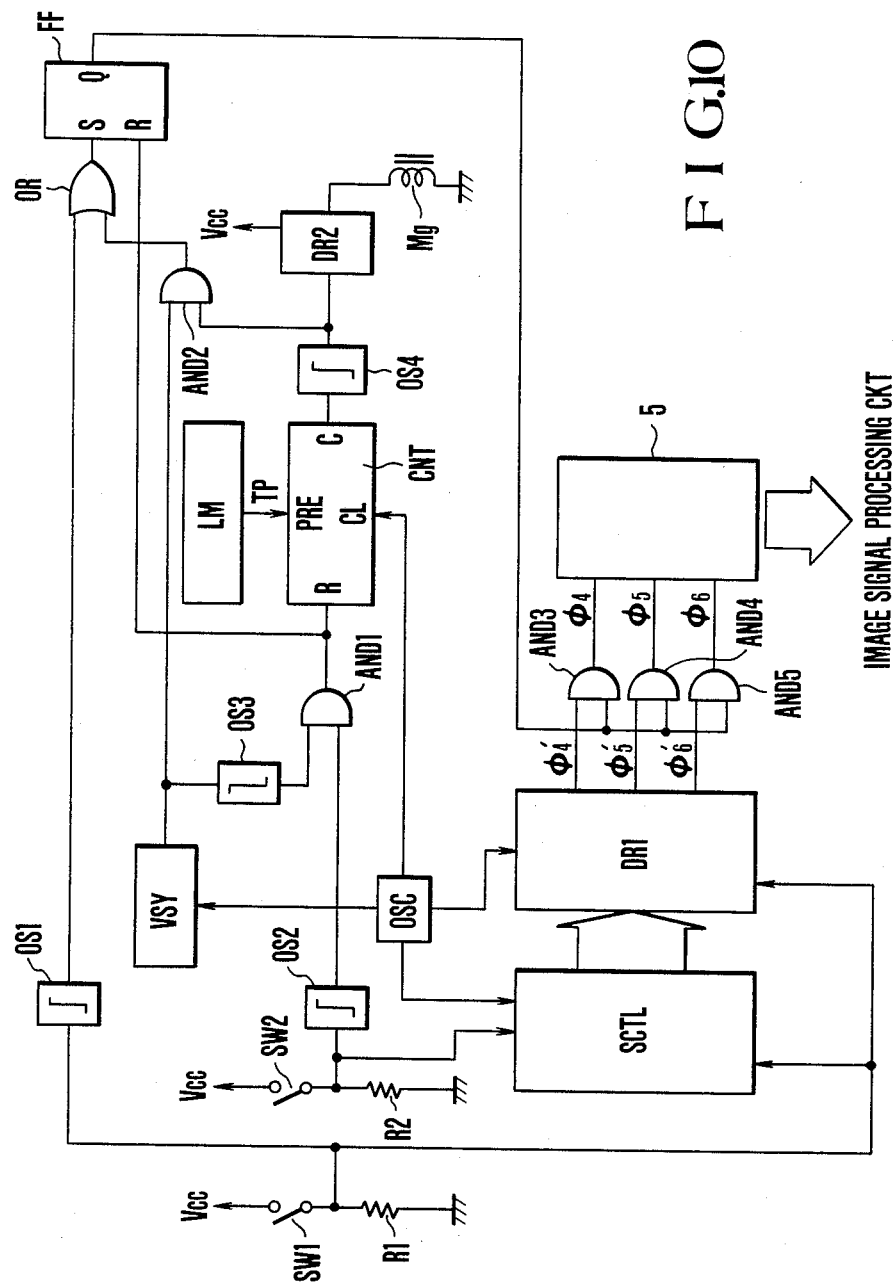
FIG. 10 shows the eighth embodiment of the image pick-up device of the present invention.
Figure 11A:
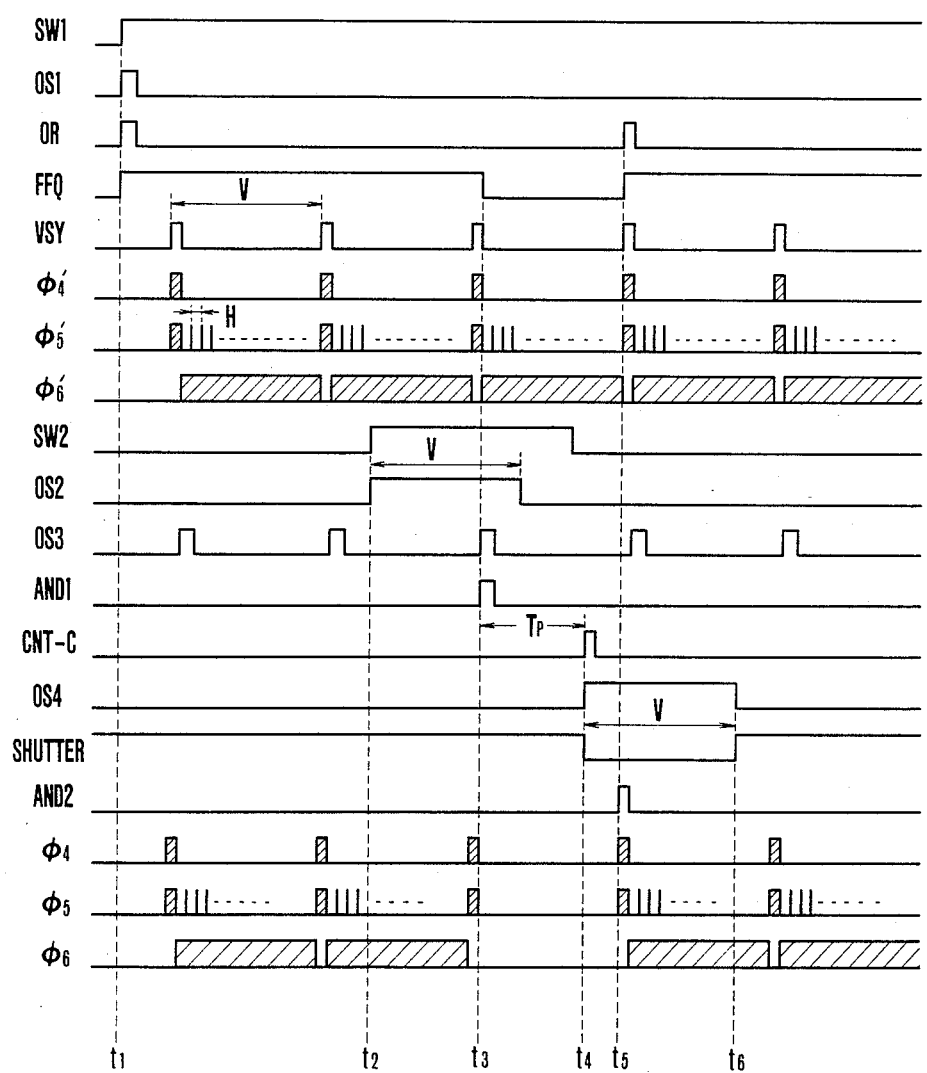
FIGS. 11(a) and (b) show the driving timing of the important parts of the embodiment in FIG. 10.

FIG. 10 shows a block diagram of the eighth embodiment of the image pick-up device of the present invention. FIGS. 11(a) and (b) show respectively a timing chart of the circuit in FIG. 10. The obliquely lined part in FIG. 11 is the pulse groups. In the drawing, SW1 is the continuous mode switch and SW2 the still mode switch, whereby the switch SW1 is closed by the first stroke of for example the 2 stroke button switch, while SW2 is closed by the second stroke. OS1 is the one shot circuit for producing a pulse in synchronization with the rising up of the switch SW1, while OS2 is the one shot circuit for producing a pulse with the width of V (FIG. 11) in synchronization of the rising up of the switch SW2. VSY is the synchronization signal generator for producing intermittent pulses with the frequency V as shown in FIG. 3 with the output of the oscillator OSC. OS3 is the one shot circuit for producing a pulse in synchronization with the falling down of the output of the synchronization signal generator, AND1–AND5 the AND gates and CNT the presettable counter to which preset input terminal PRE the output of the light measuring circuit LM is connected, whereby the preset value Tp (FIG. 11) corresponds to the exposure value. Further, R is the reset terminal, CL the clock input terminal, and C the carry output terminal for producing the high level pulse when the clocks have been counted up to the preset value. The C terminal is connected to the one shot circuit OS4 in synchronization with the rising up of the pulse width V. Further, the output of the one shot circuit OS4 controls the shutter closing magnet Mg via the magnet driver circuit DR2.

Further, the present embodiment is so constructed that the not shown shutter is normally urged by a spring along the opening direction and only while a current flows through the magnet the light sensing part (IM in the element in FIG. 2) of the image pick-up element is closed so as to be shaded.

Hereby, the shutter can not only be mechanical but also of physical property. OR is the OR gate and FF R-S flip-flop whose Q output controls the AND gates AND3–AND5. SCTL is the sequence control circuit for controlling the sequence of the whole image pick-up device.

DR1 is the driver circuit of the image pick-up element, which delivers the driving pulses φ″4–φ′6 as shown in FIG. 11 in accordance with the output of the oscillator OSC when for example the device in FIG. 2(b) is used. 5 is the image pick-up device.

FIG. 11(a) shows the timing chart when the preset value has a relation Tp<V.

Figure 11B:
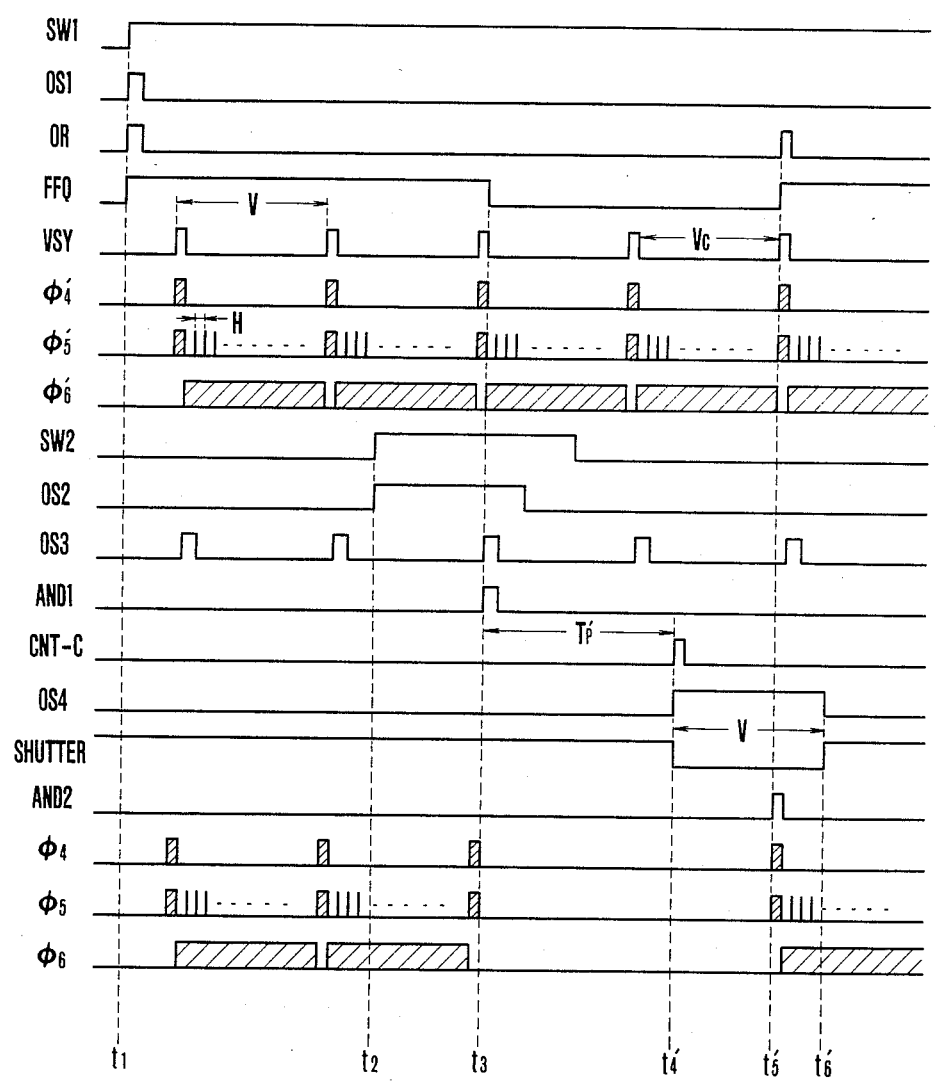

FIG. 11(b) shows the timing chart when the preset value has a relation Tp′>V.

Below the operation of the present embodiment will be explained in accordance with FIGS. 10 and 11.

When at the time point t1 the switch SW1 is closed a current is supplied to each circuit, while the one shot circuit OS1 produces a pulse so as to set the flip-flop FF. Thus, the driving pulses $\phi'4-\phi'6$ produced from the driver circuit DR1 with the output of the oscillator OSC are delivered to the image pick-up element in such a manner that the charge in the light sensing part IM is transferred to the storage part S by the pulses $\phi'4$, $\phi'5$ synchronized with the vertical synchroniztion signal during the vertical blanking period.

Further, during the vertical scanning period the next field information is formed in the light sensing part, while the previous field information in the storage part S are read out one by one by the pulses $\phi 5$ and $\phi 4$ during this period.

Consequently the continuous photographing is carried out in synchronization with the vertical synchronization signal while SW1 is closed and SW2 is opened.

When then the switch SW2 as the still mode switch is closed a pulse with the width V is formed in the one shot circuit OS2. On the other hand the synchronization signal generating circuit VSY delivers periodical pulses as shown in FIG. 3 which makes the light sensing part of the image pick-up element produce a high level signal to the storage part, whereby a pulse synchronized with the falling down of this pulse is obtained by the one shot circuit OS3. Consequently the output terminal of the AND gate AND1 delivers a pulse synchronized with the first vertical synchronization signal obtained after the switch SW2 is closed. By this pulse the counter CNT is reset (at the time point t3) and the clocks are counted for the exposure time Tp preset by the output of the light measuring circuit LM (at the time point t4), when the C terminal delivers one pulse, in synchronization with whose rising up the one shot circuit OS4 operates the magnet Mg during the period V, during which the shutter is closed. Hereby, it is desirable in order to avoid the smear that the shutter continues to be closed until the first shift pulses $\phi 4$ and $\phi 5$ after the shutter close are delivered to the image pick-up element 5. In case of the present embodiment the closing period is V taking the shutter response into consideration.

Hereby, the flip-flop FF, which has been reset with the closing of the continuous mode switch SW1, is reset with the reset of the counter (at the time point t3) and again set with the vertical synchronization signal obtained after the shutter closing so that the driving pulses $\phi'4-\phi'6$ to be delivered to the image pick-up element 5 are cut while the flip-flop FF remains reset.

Namely until the timing of the first shift pulse after the shutter closing the driving of the image pick-up element is suspended. The same thing can be said of when the exposure time Tp'>V as shown in FIG. 11(b). Consequently, the charge in the light sensing part whose exposure time is controlled with the shutter closing is read out synchronized with the synchronization signal after the shutter closing so that unnecessary signal is never recorded even when used in combination with the recording device. The read out timing is always constant (V) or integer so that the whole device can be synchronized easily. Thus, the change over to the continuous mode can be made smoothly. Further, the smear is difficult to take place and the one shot picture with high S/N can be obtained, which is effective.

Figure 12:
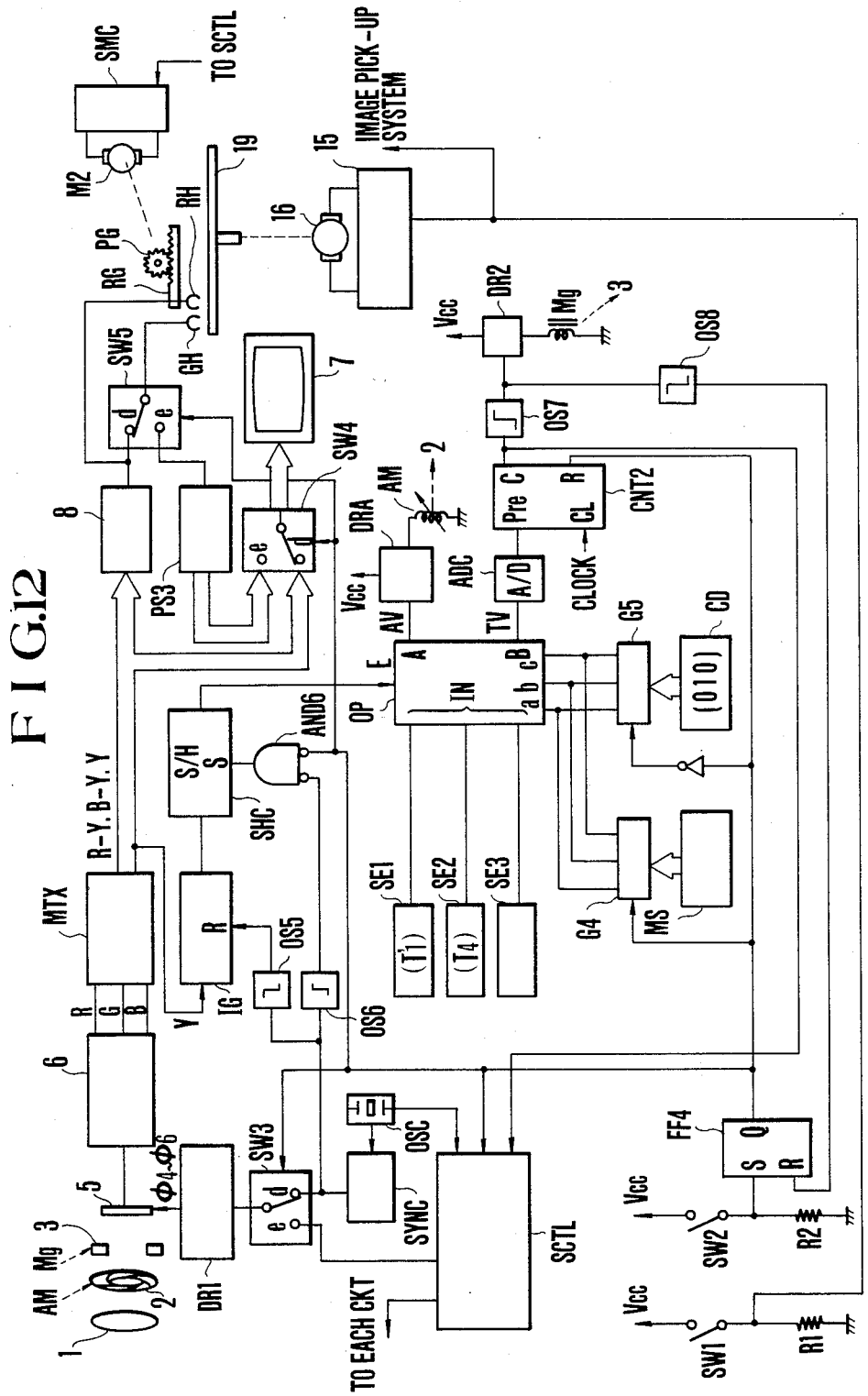
FIG. 12 shows the block diagram of an embodiment of the image pick-up device of the present invention.

FIG. 12 shows a block diagram of the third embodiment of the image pick-up device of the present invention.

Figure 13:
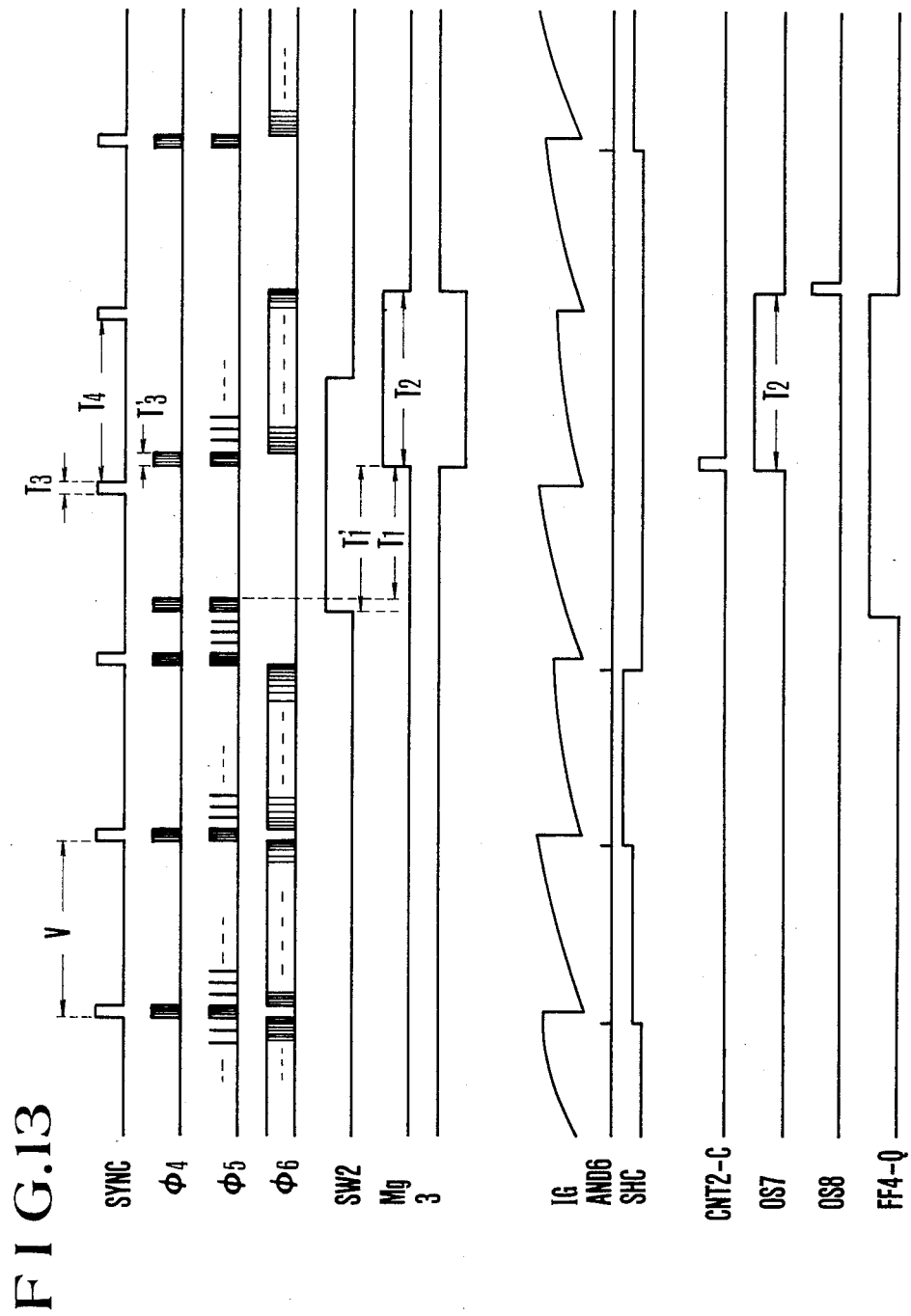
FIG. 13 shows the timing of the important parts of the circuit in FIG. 12.

FIG. 13 shows the timing of the important part in FIG. 12.

FIG. 14 shows the logic diagram of the mode selector and the continuous mode instruction circuit in FIG. 1.

In the drawing, 1 is the image pick-up optics, 2 is the diaphragm, 3 is the shutter, 5 is the solid image pick-up element, 6 is the process circuit, MTX the matrix circuit for converting the outputs RG and B of the process circuit into the color difference signals (R−Y), (B−Y) and the brightness signal Y, 8 is the recording signal processing circuit, RH the recording head and RG and PG the rack gear and pinion gear for shifting the head by one truck.

M2 is the pulse motor for driving the pinion gear PG and SMC the shift control circuit for carrying out the synchronous control of the pulse motor M2 for example with the vertical synchronization signal from the sequence control circuit SCTL to be explained later.

19 is the recording medium such as the magnetic disc which is rotated by the motor 16 for example at 3600 rpm. 15 is the disc motor control circuit for controlling the rotation of the motor. Hereby, the output of the matrix circuit MTX can be connected to the monitor device via the switch SW4. DR1 is the driver circuit for producing the driving pulses for the storage, the transfer and the read out of the image pick-up element 5 and synchronously controlled by the output of the synchronization signal producing circuit SYNC or the sequence control circuit SCTL. OSC is the standard signal generator. IG is the integrating circuit for integrating the Y signal out of the output of the matrix circuit MTX and R its reset terminal. The reset terminal R is connected to the output terminal of the one shot circuit OS5 for forming a pulse with the falling down of the output of the synchronization signal generator SYNC as shown in FIG. 13.

SHC is the sample hold circuit of the present invention for sampling the output of the above integrating circuit at a certain determined timing until the next sampling time. S is the sample signal input terminal to which the output of the one shot circuit for forming the pulse in synchronization of the rising up of the output of the above synchronization signal generator SYNC is connected via the AND gate AND6.

The output of the sample hold circuit SHC is delivered to the calculating circuit so as to be calculated with the output of the store time setting circuit SE1 in which the value can be manually input or that of the fixed store time instructing circuit SE2 or that of the aperture value setting circuit in which the value can be manually set in such a manner that as is shown in FIG. 14 the output A or B is selectively delivered in accordance with the state of the control inputs a–c.

Hereby, to the control input terminals a–c the output of the mode selector MS and that of the continuous mode instructing circuit CD are connected via the gate circuit G4 or G5. Further, the gate circuit G4 and G5 are controlled by the Q output of the RS flip-flop FF4 in such a manner that when the level of the Q output is high G4 opens and G5 closes. When it is low G4 closes and G5 opens.

The A output of the calculation circuit OP is connected to the coil of the ampere meter AM via the driving circuit DR2 in such a manner that the amount of the current supplied to AM is varied in accordance with the level of the A output. Further, the movable part of the ampere meter is constructed so as to vary the aperture value of the diaphragm.

The B output terminal of the calculation circuit OP is connected to the preset input terminal Pre of the presettable counter CNT2 via and the A/D converter ADC, while to the clock input CL of the counter the output of the above standard generator OSC is connected. C is the output terminal for producing a high level pulse when the clocks have been counted up to the set value and, R the reset input terminal connected to the output of the Q output of the flip-flop FF4. Further, the output terminal C is connected to the shutter drive circuit DR2 via the one shot circuit OS7 synchronized with the rising up of a certain determined pulse width (T2 in FIG. 13) so as to supply current to the magnet Mg in order to close the shutter only while the level of the one shot circuit is high. Further, different from the conventional shutter for the silver halid film, the shutter of the present invention is intended to present the light incident upon the above light sensing part during the transportation of the charge in the light sensing part of the image pick-up device to the store zone, being normally urged along the direction along which the shutter is opened and prohibiting the light incident upon the image pick-up element while a current flows in the magnet.

Further, the output of the above one shot circuit OS7 is connected to the reset terminal of the above flip-flop FF via the one shot circuit OS8 in synchronization of the rising up. GH is the reproducing head of the present invention, which can record the image output of the recording signal processing circuit 8 for a certain determined truck of the magnetic disc 19 via the switch SW5 while the level of the Q output of the above flip-flop FF4 is low, while when the level of the Q output of the above flip-flop FF4 becomes high the switch SW5 is changed over to the e side in such a manner that the image signal is led to the reproducing signal processing circuit PS3 so as to be monitored by the monitor device 7 via the switch SW4. Hereby, the switches SW3-SW5 are changed over to the e side when the level of the Q output of the flip-flop FF4 is high, and to the d side when the level of the Q output is low. Further, the flip-flow FF4 is designed so as to be set when the still mode start switch SW2 is closed. Further, SW1 starts the above motor control circuit 15 when closed by the continuous mode start switch.

To the remaining input terminal of the above AND circuit AND6 the Q output of the above flip-flop is connected. Further, in the still mode of the present invention the sequence control circuit SCTL delivers the driving control signal to the driver circuit DR1 instead of the above synchronization signal generating circuit SYNC and in the continuous mode the vertical synchronization signal for periodically shifting the head RH by the shift motor control circuit.

Below, the operation of the block diagram in FIG. 12 will be explained in accordance with FIGS. 12-14. Hereby, the image pick-up device of the type as shown in FIG. 2(b) is used. When the continuous mode switch SW1 is closed the motor control circuit 15 starts to operate so as to rotate the disc 19 an drive the circuit of the image pick-up system the shutter and the diaphragm, while from the synchronization signal generating circuit SYNC the synchronization signal is produced for example at the period of V as is shown in FIG. 13. This period V is set for example at 1/60 sec. This synchronization signal is delivered to the driver circuit DR1 via the switch SW3 so as to produce the pulses $\phi 4-\phi 6$ as is shown in FIG. 13.

Further, in the image pick-up element as is shown in FIG. 2(b) a not shown overflow drain is provided near the horizontal register and a barrier wall is provided between the overflow drain and the horizontal register so that when no reading out by the pulse $\phi 6$ is not carried out by only the vertical transfer by $\phi 4$ and $\phi 5$ is carried out the surplus charge is obserbed from the horizontal register by the overflow drain. The signal read out by the pulses $\phi 4-\phi 6$ is delivered to the monitor device 7 via the process circuit PS1, the matrix circuit MTX and the d side of the switch SW4 and repeatedly recorded by one field on a certain determined truck of the disc via the recording signal processing circuit PS2, the d side of the switch SW5 and the head GH. Further, the rotation period of the disc is controlled at the synchronization signal period V or the integer of V by the motor control circuit 15 in period and phase. Further, a not shown erasing head is provided on the same truck before the reproducing head GH.

Further, in the continuous mode for example the Y signal output of the matrix circuit MTX is periodically integrated by the integrating circuit IG to be reset at every rising up of the synchronization signal, whereby the integration output is sampled immediately before the resetting, namely at every rising up of the synchronization signal and held till the next sampling. Consequently, the output of the sampel hold circuit corresponds to the TTL (Through The Lens) light measurement value, although delayed by the period V from the actual time. The light measurement value E, which is input in the calculation circuit OP, is calculated with the input information from the 1N terminal so as to deliver the combined output as is shown in FIG. 14 from the terminals A and B. The outputs from the terminals A and B respectively correspond to Av (aperture value) and Tv (time value) obtained for example from APEX (additive system of photographic exposure), whereby x and y are variables.

To the control terminals a, b and c of the calculation circuit OP the logic input as is shown in FIG. 14 are delivered from the continuous mode indication circuit CD or the mode selector MS. For example, when the continuous mode switch SW1 is closed and the still mode switch SW2 is opened, namely in case of the continuous mode, the gate G5 is opened and the gate G4 is closed so that the output value (010) of the circuit CD is delivered to the input terminals a-c. Thus, as is shown in FIG. 14, the signal x corresponding to Av is delivered from the A terminal so as to control the diaphragm 2. There is no output from the B terminal. As described above in case of the continuous mode the diaphragm is controlled in accordance with the periodically sample held light measurement value, while the storing time of the image pick-up element is fixed at the time T4. As explained above, the image signal is monitored and recorded on a certain determined field memory truck. Further, the motion picture is recorded by the recording head by changing the trucks at every field one by one.

When then the still mode switch SW2 is closed after the proper mode is selected as is shown in FIG. 14 by the mode selector MS and the storing time and the aperture value are set by SE1 and SE3, the flip-flop FF4 is set so that to the control inputs a-c of the calculation circuit OP the data from the selector MS is delivered and the level of the Q output of FF4 becomes high so as to close the AND6, in such a manner that the sampling in the sample hold circuit SHC stops and the light measurement value E in the continuous mode is maintained. Further, SW3–SW5 are changed over to the e side, by the signal produced along with the setting of the flip-flop FF4 the driver circuit DR1 delivers the driving pulses $\phi 4$, $\phi 5$ as is shown in FIG. 13. Thus, the unnecessary charge in the light sensing part is cleared. Further, when the counter CNT2 is reset and the storing time corresponding to the preselected mode and the set value passes, a pulse is delivered from the C terminal to the sequence control circuit SCTL, whereby the transfer of the charge from the light sensing part of the image pick-up element to the storage part and the reading out of the storage part are started with the pulses $\phi 4$–$\phi 6$ via the driver circuit DR1. Further, in synchronization with the rising up of the pulse from the C terminal the one shot circuit OS7 delivers a pulse with the pulse width T2 as shown in FIG. 13, during which time the magnet operates to close the shutter so as to prevent the light incident upon the light sensing part. In this way no light is incident at least during the charge transfer time (T3) from the light sensing part IM to the storage part S so that the smear is avoided. Further, in case of the present embodiment the shutter is closed during T3 longer than the transfer time T3', because it is difficult to make the shutter response to such a short time as T3' and there takes place no difficulty if the time is longer than T3'. The reset signal of the flip-flop FF4 is formed by the one shot circuit OS8 in synchronization with the falling down of the one shot circuit OS7, so that it is desirable that the shutter closing time T2 is longer than the time V needed for the reading out. The reason is that there is a danger that a new picture is transferred to the storage part during the reading out of the signal in the still mode 2 if the continuous mode is resumed too easily. In case of the present embodiment V=T2. Further, in case of the present embodiment the still photographing state is maintained even if the switch SW2 is closed for a moment until the reset input of the flip-flop is delivered for the still mode photographing by the switch SW2.

Further, along with the closing of the switch SW2 the image signal delivered from the matrix circuit MTX to the monitor device is changed over into the signal recorded in the continuous mode one field by one field. Consequently, even when the continuous mode is changed over to the still mode the monitor continues to display the image immediately before the change over and there is no fear that the image shaded disappear or be disturbed.

Further, although in case of the present embodiment as the field memory a certain determined truck of the magnetic disc is exclusively used, the present invention is not limited to the analog memory as above but after the output of the matrix circuit is normally analog to digital converted the digital memory is once memorized and renewed at each field. In this case along with the change over into the still mode the content of the memory can be digital to analog converted and led to the monitor. Further, in case of the present embodiment the Y signal is obtained from the output of the matrix circuit, whereby it can be composed of the output of the process circuit. Further, it is possible to use a part of the light sensing part of the image pick-up element exclusively for smearing the light and obtain the light measurement value by integrating the output.

Further, the image pick-up device is not limited to the frame transfer type CCD as is shown in FIG. 2(b) but can be the interline transfer type CCD.

What we claim:

1. An image pick-up device comprising:
   (a) solid-stage image pick-up means, having a light sensing portion for producing electrical information corresponding to optical information and a storage portion for storing the electrical information produced by the light sensing portion;
   (b) control means for controlling the transfer of the electrical information from the sensing portion to the storage portion in the solid-state image pick-up means; and
   (c) light shading means for shading the light sensing portion during transfer of the electrical information in the light sensing portion of the solid-state image pick-up means to the storage portion.

2. A device according to claim 1, wherein the control means transfers the electrical information formed in the light sensing portion of the solid-state image pick-up means to the storage portion periodically.

3. A device according to claim 2, wherein the control means are arranged for serially reading out the electrical information held in the storage portion.

4. A device according to claim 2, wherein said shading means is arranged to shade the light sensing portion outside the period for transferring the electrical information from the light sensing portion to the storage portion.

5. An image pick-up device comprising:
   (a) image pick-up means for converting an optical image into an electrical information and having a light sensing portion and a storage portion;
   (b) scanning means for periodically scanning the electrical information in the image pick-up means;
   (c) switch means for switching on and off;
   (d) timer means for starting to count the time of a predetermined phase of the scanning period of the scanning means after switching on the switching means, and for producing an output signal after lapse of the predetermined time from the start of the timer means;
   (e) light shading means operating in accordance with the output of the timer means for allowing incidence light upon the image pick-up device until the output state of the timer means produces the signal and for preventing incidence of light upon the image pick-up means when the timer means produces the signal; and
   (f) the electrical information formed in the image pick-up means after the start of the timer being transferred from the light sensing portion to the storage portion while incidence of light upon the image pick-up means is prevented by the light shading means.

6. A device according to claim 5, wherein the transfer timing is cynchronized with the periodic scanning time of the image pick-up means by the scanning means.

7. A device according to claim 6, wherein the scanning means stops the scanning of the image pick-up means till the transfer is carried out.

8. A device according to claim 5, further comprising:
   (f) recording means for recording the output periodically obtained from the image pick-up means; and
   (g) reproducing means for repeatedly reproducing the content of the recording means in response to start of the timer means.

9. A device according to claim 5, comprising:
(h) diaphragm means for controlling the amount of the light incidence upon the image pick-up means;
(i) setting means for presetting an aperture value of a diaphragm means; and
(j) control means for controlling the diaphragm means at the value preset by the setting means in response to switch on of the switch means.

10. A device according to claim 5, further comprising:
(k) a sample and hold means for scanning and holding brightness component of the output of the image pick-up means in synchronism with the scanning period of the scanning means; and
(l) gate means for stopping the sampling of the sample hold and means in response to the switch means.

11. An image pick-up device comprising:
(a) image pick-up means for converting an optical image into electrical information;
(b) shutter means for controlling light amount incident on said image pick-up means; and
(c) control means for scanning said image pick-up means for reading out the electrical information while said shutter means is shading said image pick-up means.

12. An image pick-up device according to claim 11, wherein the image pick-up means has a light sensing portion and a storage portion.

13. An image pick-up devide according to claim 12, in which said control means is arranged to scan said image pick-up means by transferring said image information from said light sensing portion to said storage portion.

* * * * *